United States Patent [19]
Chen et al.

[11] Patent Number: 5,691,876
[45] Date of Patent: Nov. 25, 1997

[54] HIGH TEMPERATURE POLYIMIDE ELECTROSTATIC CHUCK

[75] Inventors: Aihua Chen, Fremont; Vijay Parkhe, Sunnyvale; Sergio Edelstein, Los Gatos, all of Calif.

[73] Assignee: Applied Materials, Inc., Santa Clara, Calif.

[21] Appl. No.: 381,258

[22] Filed: Jan. 31, 1995

[51] Int. Cl.$^6$ ................................................. H02N 13/00
[52] U.S. Cl. .................................................. 361/234
[58] Field of Search .................................. 361/233, 234

[56] References Cited

U.S. PATENT DOCUMENTS

| | | | |
|---|---|---|---|
| 4,565,601 | 1/1986 | Kakehi et al. | 156/643 |
| 4,645,218 | 2/1987 | Ooshino et al. | 279/1 M |
| 4,724,510 | 2/1988 | Wicker et al. | 361/234 |
| 4,838,978 | 6/1989 | Sekine et al. | 156/345 |
| 4,846,929 | 7/1989 | Bard et al. | 156/630 |
| 4,897,171 | 1/1990 | Ohmi | 204/298 |
| 5,221,403 | 6/1993 | Nozawa et al. | 156/345 |
| 5,250,137 | 10/1993 | Arami et al. | 156/345 |
| 5,255,153 | 10/1993 | Nozawa et al. | 361/234 |
| 5,270,266 | 12/1993 | Hirano et al. | 437/228 |
| 5,275,683 | 1/1994 | Arami et al. | 156/345 |
| 5,310,453 | 5/1994 | Fukasawa et al. | 156/643 |
| 5,314,573 | 5/1994 | Higuchi et al. | 156/643 |
| 5,348,497 | 9/1994 | Nitescu | 439/824 |
| 5,486,975 | 1/1996 | Shamouilian et al. | 361/234 |
| 5,515,167 | 5/1996 | Ledger et al. | 356/357 |
| 5,528,451 | 6/1996 | Su | 361/234 |

OTHER PUBLICATIONS

Rajan Kanakarajan, "New Adhesiveless Substrates for FPC and MCM-L", *IPC Technology Roadmap Code # M2*, IPC Printed Circuits Expo, Apr. 25, 26, and 27, 1994, pp. 1–2, Published by IPC, 7380 N. Lincoln Ave. Lincolnwood, Illinois 60646–1705.

*Primary Examiner*—Fritz Fleming
*Attorney, Agent, or Firm*—Shirley L. Church; Donald Verplancken

[57] ABSTRACT

In accordance with the present invention, two types of polymeric dielectric systems useful in construction of a high-temperature electrostatic chuck are disclosed. Further, a high temperature power connection for transmitting power from a supply source to a conductive extension from the electrostatic chuck conductive layer is described. The first polymeric dielectric system provides for the use of polyimide films which do not require an adhesive to adhere to an underlying substrate support platen. The self-adhering polyimide film comprises from one to three layers of polyimide material, wherein at least one outer layer of polyimide material is thermoplastic in nature, for the purpose of adhesion and/or encapsulation. When the film comprises two layers, one of the layers is a non-thermoplastic polyimide having an increased glass transition temperature of about 350° C. or greater. When the film comprises three layers, typically the center layer is the non-thermoplastic polyimide, with the upper and lower layers being a thermoplastic polyimide. The thermoplastic polyimide is placed in contact with a substrate to which it is to bond (such as the surface of a conductive platen used to support a semiconductor workpiece) and heat and pressure are applied to cause the thermoplastic polyimide to flow and bond to the substrate. The second polymeric dielectric system provides for the use of a liquid polyamic acid or modified polyimide precursor which is cured in place against a substrate to provide a polyimide-comprising film adhered to the substrate. Depending on the composition of the polyamic acid or modified polyimide precursor, various degrees of crystallinity can be achieved in the cured, solid polyimide.

17 Claims, 4 Drawing Sheets

HIGH TEMPERATURE POLYIMIDE ELECTROSTATIC CHUCK

BACKGROUND OF THE INVENTION

1. Field of the Invention

The present invention pertains to an electrostatic chuck used to hold substrates in position during semiconductor processing. The electrostatic chuck is capable of functioning at temperatures greater than 175° C., and preferably greater than 300° C. The electrostatic chuck includes at least one conductive layer positioned between two polyimide-comprising dielectric layers. A specially designed electrical connector capable of operating at the same elevated temperatures is used to supply power from a high DC power source to the conductive layer within the electrostatic chuck.

2. Brief Description of the Background Art

Electrostatic chucks are devices which have gained wide usage in the semiconductor field for clamping semiconductor wafers during manufacturing processes. These chucks eliminate the need for mechanical clamping mechanisms, which are often clumsy and induce contamination into processing chambers. In addition, a clamping mechanism rests on the surface of the substrate and prevents full face utilization of the surface of the substrate. The most popular electrostatic chucks are multilayered structures fabricated using polyimide for the dielectric layers. Polyimide has desirable properties such as high temperature stability (relative to other organic polymers), good dielectric behavior, and excellent mechanical properties. To date, such electrostatic chucks have been used primarily in plasma etching processes, since these processes are carried out at about 130° C. or less. The 130° C. temperature is about the maximum sustainable operational temperature for electrostatic chucks fabricated from conventional polyimides used in combination with non-polyimide adhesive layers. For example, a non-polyimide adhesive layer is frequently used to attach the bottom polyimide of an electrostatic chuck to an underlying metallic pedestal. The underlying pedestal or platen is used to support the semiconductor substrate, to provide heating and cooling of the substrate, and to act as an electrode in many applications.

U.S. Pat. No. 4,645,218 to Ooshio et al., issued Feb. 24, 1987, describes an electrostatic chuck having: an electrostatic attraction body; an electrostatic conductive support body for supporting the electrostatic attraction body; channels for passing cooling medium through the support body; and, a means for covering the exposed surfaces of the support body, except the portion over which the workpiece is placed. The electrostatic attraction body comprises an insulation layer and an adhesive layer which bonds the insulation layer to an underlying platen or pedestal. The insulation layer is a three film composite having a polyimide or polyester upper and bottom dielectric film with an electrode film sandwiched between the upper and bottom dielectric films. The electrostatic chuck is said to be used in a process apparatus such as a dry-etching apparatus, with no reference given as to operational temperatures.

U.S. Pat. No. 4,897,171 to Tadahiro Ohmi, issued Jan. 30, 1990 discloses a wafer susceptor capable of adsorbing a wafer by an electrostatic force and of regulating an electric potential of the wafer to a predetermined value in time. The susceptor comprises a first conductive electrode which includes its flat surface covered with a thin insulating film; a second conductive electrode which is electrically insulated from the first conductive electrode and is disposed so that its surface is flush with the surface of the thin insulating film which covers the first conductive electrode; a means for imparting a specified electric potential to the second conductive electrode; and a means for applying a predetermined voltage between the first conductive electrode and the second conductive electrode.

U.S. Pat. No. 5,221,403 to Nozawa et al., issued Jun. 22, 1993, describes a wafer support table used in a vacuum chamber of a magnetron plasma etching apparatus. The wafer support table includes a member having an electrostatic chuck for supporting the wafer on its upper surface. The electrostatic chuck is constituted of two insulating sheets (polyimide, for example) having an electrically conductive sheet positioned between the insulating sheets. The electrically conductive sheet consists of copper, for example. The maximum operational temperature given is 70° C. to 80° C.

U.S. Pat. No. 5,250,137 to Arami et al., issued Oct. 5, 1993, describes a plasma etching apparatus including an electrostatic chuck constructed of two insulating films having a conductive layer sandwiched therebetween. The conductive layer is said to be made of copper, for example, with the insulating films being made of polyimide, for example. A power supply head is also described which includes a coil spring within an insulating cylindrical body, where the coil spring serves to push upward the power supply head to permit connection of the head to an exposed conductive layer within the electrostatic chuck. No particular temperature of operation is described or claimed.

U.S. Pat. No. 5,275,683 to Arami et al., issued Jan. 4, 1994, discloses a wafer mount useful in a plasma etching apparatus. The mount includes an electrostatic chuck member arranged on top of a susceptor, the electrostatic chuck member having a rim which is curved downward along the curved rim section of the susceptor, departing from the marginal portion of a semiconductor wafer mounted thereon. The electrostatic chuck sheet is said to comprise a pair of polyimide resin films with a thin conductive film such as a copper foil sealed between the polyimide resin films. The films are particularly recommended to be made of a non-crystallized aramid resin having a thickness of about 50 µm, as an alternative to a polyimide resin. The maximum temperature discussed is about 35° C.

U.S. Pat. No. 5,314,573 to Higuchi et al., issued May 24, 1994, describes a dry etching method for anisotropic etching of a semiconductor wafer. The apparatus used comprises an electrostatic chuck having a chuck body constituting the lower electrode, and an electrostatic suction sheet which is flexible and disposed to cover the upper surface of the chuck body. The electrostatic suction sheet included two insulating polyimide sheets and a conductive sheet interposed between the two polyimide sheets. The two polyimide sheets are fused to each other such that the fused portion covers the periphery of the conductive sheet. The maximum operational temperature described for use of the electrostatic chuck is about 130° C.

Although electrostatic chucks using polymeric insulating layers are frequently described for plasma etching at temperatures of 130° C. or less, they have not been described for use at higher temperatures, to the knowledge of applicants. This is due principally to performance limitations of the polymeric adhesives used to attach them to an underlying substrate surface. In any case, it would be highly advantageous to have an electrostatic chuck capable of functioning at temperatures of 200° C. or higher which is fabricated from polymeric insulating layers which tend to be less expensive and offer improved flexibility over ceramics and various oxides which might be used as an alternative.

SUMMARY OF THE INVENTION

In accordance with the present invention, a high temperature electrostatic chuck includes at least one polyimide-comprising film acting as a dielectric layer within the electrostatic chuck, wherein the polyimide-comprising film has a sustained operational temperature of at least 175° C. Preferably the electrostatic chuck comprises at least one first polyimide-comprising film adhered to an underlying substrate, at least one conductive layer overlaying the first polyimide-comprising film, and a dielectric film overlaying the conductive layer, wherein the first polyimide-comprising film has a sustained operational temperature of at least 175° C. In addition, in the most preferred embodiment, the dielectric layer selected to overlay the conductive layer is preferably a second polyimide-comprising film also having a sustained operational temperature of at least 175° C.

The sustained operational temperature of at least 175° C. is obtained by the use of a polyimide-comprising film which does not require a non-polyimide polymeric adhesive layer to adhere it to an underlying substrate support platen. Further, the polymeric materials used to provide the polyimide-comprising film exhibit unique high temperature performance capabilities.

A preferred polymeric material for use in fabrication of an electrostatic chuck having the above-described high temperature performance characteristics is a self-adhering polyimide-comprising film (used to form either the first polyimide-comprising film or both the first and the second polyimide-comprising films) which includes from one to three layers of polyimide-comprising material, wherein at least one outer layer of polyimide-comprising material is thermoplastic in nature, for the purpose of adhesion and/or encapsulation. When the film comprises two layers, the second layer is a non-thermoplastic polyimide-comprising material having an increased glass transition temperature of about 175° C. or greater. When the film comprises three layers, typically the center layer is the non-thermoplastic polyimide-comprising material, with the upper and lower layers being the thermoplastic polyimide-comprising material. The thermoplastic polyimide-comprising material is placed in contact with a substrate to which it is to bond (such as the surface of a conductive platen used to support a semiconductor workpiece) and heat and pressure are applied to cause the thermoplastic polyimide-comprising material to flow and bond to the substrate.

A second preferred polymeric material for use in fabrication of an electrostatic chuck having sustained operational temperatures of at least 175° C. is a liquid polyamic acid or modified polyimide precursor which is cured in place (in situ) against the substrate (eg. a wafer support platen), to provide adhesion to the substrate. The self-adhering polyimide-comprising film can be formed in situ to provide either the first polyimide-comprising film or both the first and the second polyimide-comprising films of the electrostatic chuck previously described. Depending on the composition of the polyamic acid or modified polyimide precursor, various degrees of crystallinity can be achieved in the cured, solid polyimide. One particularly advantageous polyimide precursor is a siloxane-modified polyamic acid. The polyamic acid or polyimide precursor may contain a dielectric such as silica, a glass ceramic or alumina to improve abrasion resistance and electrical properties.

Typically, the liquid precursor for the cured polyimide-comprising material is spin coated (using standard techniques known in the art) upon the surface of a conductive platen of the kind used to support a semiconductor workpiece, followed by heat treatment (baking) to convert or partially convert the precursor into a polyimide. The surface of the solid polyimide-comprising film obtained in this manner is conformal to the surface of the conductive platen, which can be particularly shaped to provide better conduction of heat to the workpiece supported by the platen. Particularly thin layers of polyimide-comprising dielectric can be achieved using this technique. Thinner layers of polyimide-comprising dielectric provide an electrostatic chuck having better heat transfer characteristics and requiring lower voltages for operation. There are large numbers of precursor materials which will provide a cured polyimide-comprising film having a sustained operational temperature in excess of 400° C., while maintaining adequate dielectric breakdown field, volume resistivity and surface resistivity required in a functioning electrostatic chuck.

The electrostatic chuck requires an electrical connector to provide power transmission to the conductive layer sandwiched between the first and second dielectric layers. Thus, in addition to the polyimide-comprising dielectric materials capable of sustaining operational temperatures in excess of about 175° C. (and preferably 300° C.), it is necessary to have an electrical connector capable of functioning at such temperatures.

One preferred electrical connector of the present invention is comprised of a conductive contact button, preferably constructed from stainless steel, attached to a spring, preferably constructed from stainless steel, which is further attached to a solid conductive center contact, preferably fabricated from niabrium. An insulating layer of a dielectric material (such as 95–97% alumina) surrounds at least a portion of the conductive center contact. The insulating layer is circumscribed by a conductive clip, preferably constructed from Kovar (a group of alloys, e.g., Fe 53.8%, Ni 29%, Co 17%, Mn 0.2%), which is designed to be welded in place within a surrounding stainless steel support structure. In a preferred embodiment of the present invention, the surrounding support structure is a substrate support platen, and the electrical connector makes contact with a conductive extension (which includes an electrical connection) from the conductive layer in the electrostatic chuck. The conductive extension extends into the support platen.

A second preferred electrical connector of the present invention comprises a solid center contact of an alloy having a coefficient of expansion matched to both an insulator and the material of construction of the substrate support platen. The insulating material surrounds at least a portion of the conductive center contact. This center contact with circumscribing insulating layer is fitted into an opening machined into the substrate support platen in a manner such that the insulating layer isolates the solid center contact from the platen. The assembly of solid center contact with insulating layer and platen is then is processed (typically heated with or without a flux agent) so that the insulating layer becomes bonded to both the solid center contact and the support platen. The support surface of the substrate support platen including connectors formed in this manner can then be polished if necessary to provide a planar surface. The connectors make contact with a conductive contact which extends from the conductive layer of the electrostatic chuck, preferably in the form of a coplanar feedthrough.

DETAILED DESCRIPTION OF THE PREFERRED EMBODIMENTS

Sputtering describes a number of physical vapor deposition techniques (such as DC plasma enhanced sputtering, RF plasma, and ion gun) commonly used in the semiconductor industry for the deposition of thin films of various metals such as aluminum, aluminum alloys, refractory metal silicides, gold, copper, titanium-tungsten, tungsten, molybdenum, and tantalum, and less commonly, silicon dioxide and silicon onto an item (a substrate). A typical plasma sputtering process utilizes considerable energy and it is not unusual for the temperature of the substrate support platen to rise above 175° C. In fact, operating conditions in some sputtering processes use temperatures in excess of 400° C., voltages as high as 2,000 volts (typically ranging from about 500 to about 1,000 volts), and a process chamber base pressure preferably in the range of $10^{-8}$ to $10^{-9}$ Torr.

Figure 1:
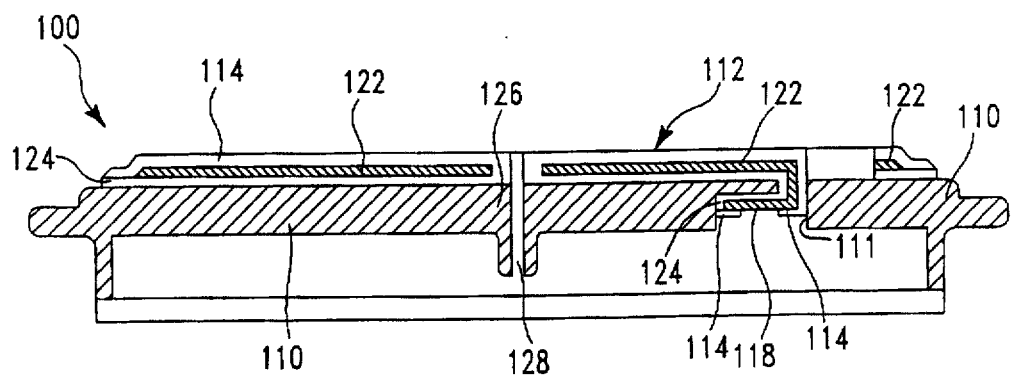
FIG. 1 shows a schematic of a side view of assembly 100 comprising an underlying support structure 110 (for example, a wafer support platen which functions as a susceptor of the kind useful in physical vapor deposition) with an electrostatic chuck 112 attached to the surface of support structure 110.
Figure 2:
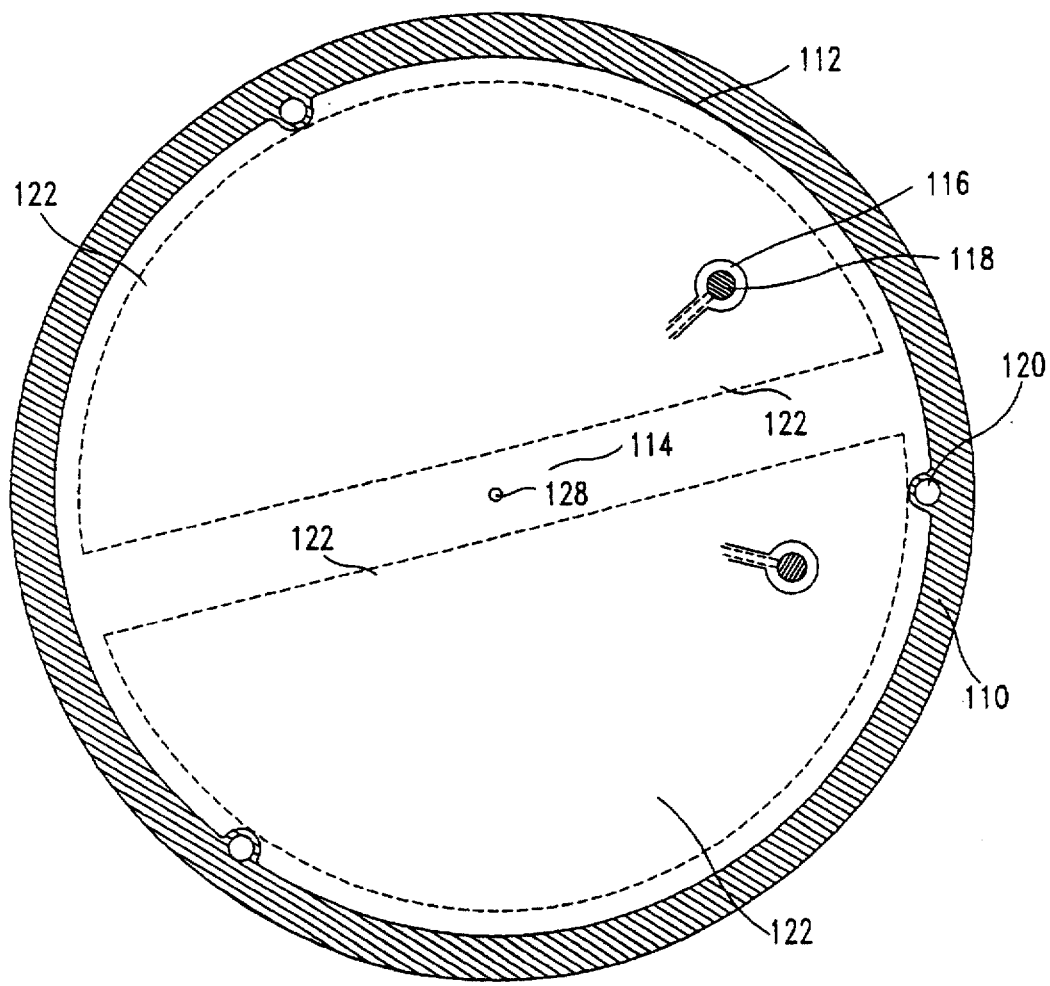
FIG. 2 illustrates a top view of an electrostatic chuck 112 positioned over the surface of a wafer support platen 110, prior to insertion of electrical connector extensions 116 into wafer support platen 110.

The present invention pertains to an electrostatic chuck means which is stable at operational conditions where the temperature of operation rises above 175° C., such as those described above for physical vapor deposition, with the precise stability of the electrostatic chuck depending on the materials of construction. FIG. 1 shows a side view schematic of an assembly 100 of the present invention which includes an electrostatic chuck means 112 atop a substrate/workpiece support platen 110 which can function as a susceptor in a physical vapor deposition process, for example. Electrostatic chuck 112 comprises a first self-adhering dielectric layer 124 adhered to a workpiece support platen 110; a conductive layer 122 which overlays the first dielectric layer 124 (Conductive layer 122 can be patterned into various geometries and may be monopolar or bipolar. FIG. 2 illustrates a bipolar conductive layer pattern.); and a second self-adhering dielectric layer 114. Workpiece support platen 110 includes an opening 111 through which a conductive extension 116 (shown in FIG. 2) extends to furnish an electrical contact surface 118 through which power is connected to conductive layer 122. High voltage ranging from about 200 to about 2,000 volts is applied to the conductive layer 122 to create polarization of the insulating dielectric films, creating static electricity on the surface of the second self-adhering dielectric layer 114, so that the workpiece (typically a silicon wafer, not shown) is attracted and held on the support platen 110 by the coulomb force of this static electricity. Although the support platen 110 shown in FIG. 1 is for a circular silicon wafer, such a platen may be rectangular or have any shape advantageous to the substrate used for production of the semiconductor device. Typically, to provide improved heat transfer to the workpiece (not shown) which is held to the surface of second self-adhering dielectric layer 114, a heat transfer gas is fed to the surface of dielectric layer 114 through a conduit 128. Conduit 128 leads to gas directing channels in the surface of dielectric layer 114 (not shown). The channels can take various geometrical forms. Heat transfer gas is fed through conduit 128 to the gas directing channels during processing of the substrate/workpiece. Since there are numerous processes known in the art for etching polyimides, the gas directing channels can easily be etched into a polyimide-comprising dielectric layer 114.

At least one, and preferably both of the insulating dielectric layers of the electrostatic chuck means 112 are constructed from a polymeric dielectric material such as polyimide, which provides flexibility and low cost in comparison with ceramic and oxide dielectric materials in general, but as previously described, conventional polyimide materials have been inadequate to permit construction of an electrostatic chuck capable of functioning at temperatures much higher than about 150° C. The present invention enables the use of polyimide-comprising dielectric layers having a sustained operational temperature of 175° C. or greater. By sustained operational temperature it is meant that at least 10,000 substrates/workpieces can be processed, and preferably at least 50,000 workpieces with the electrostatic chuck remaining fully functional.

The First Polymeric System for Formation of a Dielectric Film or Layer

FIGS. 1 and 2 illustrate one preferred embodiment multilayer electrostatic chuck means 112 of the present invention. The electrostatic chuck means 112 is comprised of an upper, second polyimide film 114, an internal patterned conductive layer 122, and a lower, first polyimide film 124. Second polyimide film 114 and first polyimide film 124 extend beyond internal patterned conductive layer 122, as shown in FIG. 1, so that conductive layer 122 is isolated between the two polyimide films. Electrical connection extensions 116, punched out of the multilayer electrostatic chuck 112, extend downward into a support platen 110. As shown in FIG. 2, electrical connection extensions 116 for the bipolar conductive layer 122 each include an electrical contact surface 118 which has been formed by removal of a portion of the upper, second polyimide layer 114. Electrostatic chuck means 112 is positioned upon support platen 110 relative to positioning pins 120 which assist in lining up conductive extensions 116 with openings 111 in support platen 110.

Lower first polyimide film 124 is adhered to support platen 110; previously this has been achieved using methyl methacrylate (acrylic) based adhesive layers, however such adhesive layers cannot withstand temperatures in the range of about 175° C. To avoid the need to use such acrylic adhesives, we have formed first polyimide film 124 using a newly-developed polyimide film which is sufficiently thermoplastic that it can flow and bond to conductive support platen 110 under the application of heat and pressure. A preferred material for use as lower polyimide film 124 is Kapton® KJ, available from DuPont. Kapton® KJ is a thermoplastic polyimide adhesive film with a glass transition temperature (Tg) around 220° C. Kapton® KJ is available in thicknesses as low as 0.5 mil (12 microns), has a relatively low Z-axis coefficient of thermal expansion (CTE, ca. 65 ppm/°C.), and most physical properties are comparable to other polyimide films. At elevated temperatures Kapton® KJ has two softening points, with a second transition temperature above the Tg of 220° C., in the range of 280° C. to 350° C., which may be considered as the crystalline transition (Tm). This second transition temperature range functions as a process window for effective bonding of the Kapton® KJ to a metallic substrate such as conductive support platen 110 (typically constructed of stainless steel). Kapton® KJ has been shown to bond to a variety of metallic and non-metallic substrates. Bonding is accomplished above 280° C., and DuPont recommends bonding at 350° C. and 500 psi using a vacuum assisted hydraulic press or autoclave for bonding the Kapton® KJ to composites including copper, steel, ceramics, and films.

Conductive layer 122 of electrostatic chuck means 112 can be constructed from a number of materials such as copper-surfaced cladply polyimide film, aluminum cladply polyimide film, and aluminum-filled polyimide film available from Ablestik Laboratories, Rancho Dominguez, Calif. One preferred conductive layer 122 is available from DuPont as Paralux® AP, an adhesiveless composite of polyimide film bonded to copper foil. The copper is typically rolled annealed copper, but electrodeposited copper is also available.

Other materials available for use in construction of electrostatic chuck means 112 include polyimide cladply materials available from DuPont under the trade names Kapton® HKJ and EKJ. Kapton® HKJ and EKJ are heat-sealable/ self-adhering composite films, generally consisting of at least one layer of Kapton® KJ on top of a core polyimide film layer that is non-thermoplastic and has a higher glass transition temperature (eg. Tg 350° C.). The non-thermoplastic core layer may be selected from materials such as commonly used H-polymer (PMDA/ODA) or from E-polymer (a low thermal expansion polymer of undefined composition available from DuPont). The layer thickness of cladply materials can be varied to meet specific needs. In addition, the cladply material can have a thermoplastic adhering layer on one side or on both sides of the non-thermoplastic core layer, depending on the application. Typically the thermoplastic adhesive layer thickness ranges from about 0.1–0.5 mils (2.4 µ–12 µ), while the core layer thickness ranges from about 0.5–2.0 mils (12 µ–48 µ). Thermal coefficient of expansion for the cladply material having an H-polymer core is about 45 ppm/°C., dielectric strength is about 5600 v/mil, dielectric constant is 3.22 at 1kc, and the dissipation factor is 0.002. Thermal coefficient of expansion for the cladply material having an E-polymer core is about 25 ppm/°C., dielectric strength is about 6000 v/mil, dielectric constant is 3.5 at 1kc, and the dissipation factor is 0.002.

The multilayer electrostatic chuck means 112 illustrated in FIGS. 1 and 2 can be constructed using the materials described above. For example a commercially available copper-surfaced cladply polyimide film having a core layer in the center with a thermoplastic adhering layer on each side and a copper layer deposited upon the surface of each thermoplastic adhering layer can be modified for use in the present invention. One of the surface copper layers is patterned to produce the desired conductive pattern using standard photoresist and wet etch techniques, while the other surface copper layer is removed during the wet etch process. This provides a modified cladply material having the desired conductive pattern 122 on one surface, overlying a thermoplastic adhering polyimide layer, overlying a high temperature core center layer, which overlays a thermoplastic self-adhering polyimide layer (the combination providing underlaying polyimide layer 124 having conductive patterned layer 122 on its upper surface). The lower surface of the modified cladply material is the thermoplastic self-adhering polyimide which can be bonded to support platen 110 directly. A second polyimide-comprising layer 114 (a thermoplastic self-adhering polyimide-comprising film with or without a high temperature core layer) can be applied over the surface of the modified copper-surfaced cladply polyimide film so that the thermoplastic self-adhering polyimide-comprising layer is bonded to the conductive patterned layer 122 of the modified cladply polyimide film which provides underlying polyimide dielectric layer 124, providing an electrostatic chuck structure. This multilayer structure, when bonded together provides an excellent electrostatic chuck means; further, the thermoplastic adhering layer on the lower surface of dielectric film 124 is bonded to conductive wafer support platen 110 simultaneously with the internal bonding of the multilayer electrostatic chuck structure 112. The multilayer structure can be punched to provide openings such as heat transfer gas conduit 128 and electrical connection extensions 116. The prepared multilayer punched structure is placed upon support platen 110, the electrical connection extensions 116 are inserted into position within support platen 110, the assembly is vacuum bagged, and cure/bonding is achieved in an autoclave at approximately 350° C. and 500 psi. Since copper and aluminum have a tendency to undergo oxidative degradation, it is critical that the assembly be vacuum bagged to remove air. Further, maintenance of the vacuum on the assembly during processing provided for the removal of volatiles and moisture that might otherwise create blisters within the structure. Typically a stripable bleeder lining is included within the vacuum bag so that flowing polyimide and volatiles will not close the vacuum path. The preferred embodiment of the multilayer electrostatic chuck means 112 is constructed using Kapton® EKJ cladply due to its lower thermal coefficient of expansion.

EXAMPLE 1

Construction of an Electrostatic Chuck Using the First Polymeric System

1. Preparation of a Substrate

Figure 6:
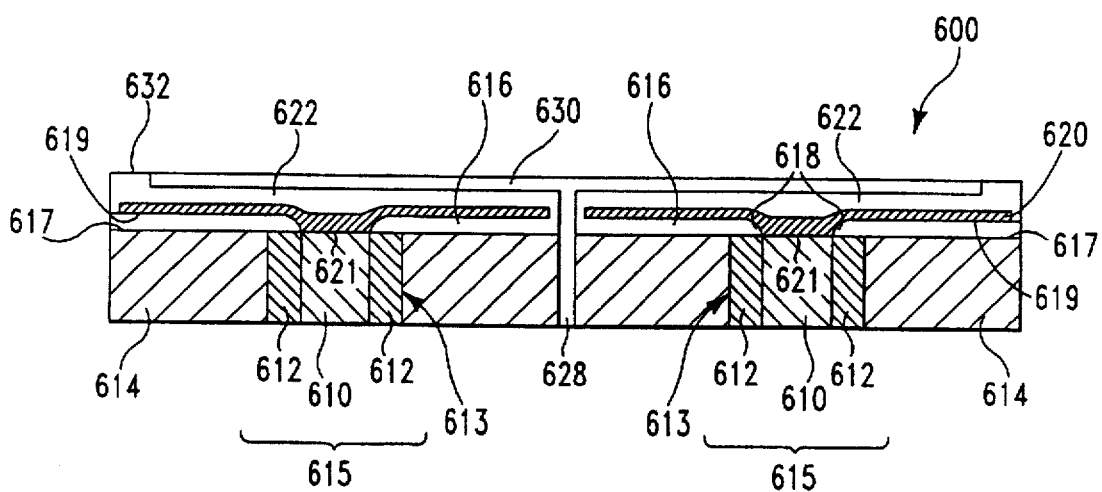
FIG. 6 shows a schematic of a first preferred high temperature electrical connection of the present invention. This connection is a coplanar feed through connection.

FIG. 6 illustrates the more preferred electrostatic chuck embodiment 600 for use in the present invention. A 316 stainless steel substrate support platen 614 was machined and cleaned. Electrical feedthrough openings 613 were fabricated within the substrate support platen 614 in two locations by: inserting into openings 613 (machined through the entire thickness of the support platen) an electrical connector assembly 615 comprising a solid center contact 610 of Inconel® 750 circumscribed by a layer 612 of glass ceramic; and, heating the substrate support platen 614 and electrical connector assembly 615 so that the glass ceramic layer 612 became bonded to both the solid center contact 610 and the support platen 614. The support surface 617 of the substrate support platen 614 including connector assemblies 615 was then polished to provide an especially planar surface. With reference to FIG. 6, the electrical connector solid center contact 610 was selected to be an alloy having a coefficient of expansion compatible with the insulating layer 612, which further had to have a coefficient of expansion compatible with the support platen 614 material. In addition, the insulating layer 612 was selected to be a material which could flow and bond center contact 610 to support platen 614. A preferred material of construction for solid center contact 610 is a nickel and chromium alloy such as Inconel® 750. The insulating layer 612 of a dielectric material in the form of a glass ceramic which exhibits a coefficient of expansion compatible with the Inconel® 750 and the surrounding stainless steel platen. Insulating layer 612 is selected to have a coefficient of thermal expansion (CTE) which is within about 10% of the CTE of the solid center contact 610 (preferably within about 5%). Further, the CTE of insulating layer 612 should be within the range between the CTE of solid center contact 610 and the CTE of support platen 614 to reduce the stresses created within and between the various components of the connector over the operational temperature range of the electrostatic chuck. The electrical connector illustrated in FIG. 6 is referred to as a coplanar feed through connector and has been demonstrated to be capable of withstanding a vacuum of $10^{-9}$ Torr.

The heat transfer between support platen 614 and the substrate/workpiece (not shown) which sits upon the surface 632 of the electrostatic chuck structure 600 is greatly improved over heat transfer achieved through electrostatic chuck structures in the past, due to the thin dielectric layers and the thin patterned conductive layer which can be achieved using the method and materials disclosed in the present invention. However, if desired, a heat transfer gas conduit 628 can be constructed through platen 614 and through the dielectric layers to the surface 632 of electrostatic chuck structure 600. Gas flow channels 630 can be constructed in surface 632 to permit flow of a heat transfer gas over at least a portion of surface 632.

2. Construction of a Preferred Embodiment Electrostatic Chuck

After preparation of the stainless steel substrate support platen 614 containing coplanar feed through connections 610, the next process involved making a dielectric/conductor/dielectric layered structure on the surface 617 of platen 614, with the conductor layer having connections in contact with the coplanar feed through connections 610.

A first thermoplastic polyimide-comprising film 616 ranging in thickness from about 1 mil (25.4 μ) to about 3 mils (76.2 μ), preferably about 1.5 mil (38.1 μ), comprising a bottom thermoplastic polyimide layer and a top non-thermoplastic core layer was placed upon the support platen 614. First thermoplastic polyimide-comprising film 616 contained two openings 618 which were positioned to overlay electrical connector assemblies 615. Lamination of the first thermoplastic polyimide-comprising film 616 to support platen surface 617 was achieved in an autoclave at about 400 psi and at a temperature of about 350° C.

A thin layer 619 of chromium, ranging between about 100 Å and about 300 Å, preferably about 250 Å, was sputtered through a mask upon the surface of thermoplastic polyimide-comprising film 616 to improve the adhesion of a layer 620 of copper which was subsequently sputtered over the surface of the chromium, to create both a conductive layer electrode pattern and to make contact with the electrical connector assemblies 615. The thickness of sputtered copper layer 620 was about 2,500 Å. A sputtered conductive layer having a thickness ranging from about 1,000 Å to about 3,000 Å provides for reduced stress in the conductive layer over the stress in thicker layers, and the reduced stress provides better conduction.

The electrostatic chuck structure was then completed by lamination of a second polyimide-comprising film 622 over the surface of the conductive layer electrode pattern. The second polyimide-comprising film 622 ranged in thickness from about 1 mil (25.4 μ) to about 3 mils (76.2 μ), preferably about 1.5 mil (38.1 μ), comprised a bottom thermoplastic self-adhering polyimide layer and a top non-thermoplastic core layer. The thermoplastic self-adhering polyimide layer was placed in contact with conductive layer 620. The lamination procedure was the same as that used for the first polyimide-comprising film 616.

Alternatively, the second polyimide-comprising film 622 is formed by spin coating a layer of Pyralin® SP PI-1111 liquid high temperature polyimide over the surface of conductive layer 620. The spin coated polyimide is hard baked to a thickness of about 1.5 mil (38.1 μ) to complete the electrostatic chuck structure. A more detailed description of the use of polyimide films prepared from liquid precursor materials follows.

The Second Polymeric System for Formation of a Dielectric Film or Layer

A second polymeric dielectric system useful in the production of a multilayer electrostatic chuck structure of the kind shown in FIGS. 1, 2, and 6 is a polyimide-containing polymer formed from a liquid precursor.

With reference to FIGS. 1, and 2, use of a liquid precursor which is polymerized in place against the surface of wafer support platen 110 provides for both mechanical bonding into any surface roughness (natural or created) on the support platen (as the liquid can flow into such interfacial roughness) and chemical bonding between the material making up support platen 110 and the liquid precursor material.

Liquid precursor materials which function well in the present invention include Pyralin® SP PI-1111 polyimide coatings available from DuPont, and in particular the Pyralin® PD PI-2700 and PI-2555 series of photosensitive polyimide coatings. These latter materials are based on a backbone prepared from benzophenone tetracarboxylic dianhydride (BTDA), oxydianiline (ODA), and metaphenylene diamine (MPD). The Pyralin® PD polyimide coatings exhibit the following cured film properties: Glass transition temperatures ranging from about 320° C. to greater than 400° C.; thermal coefficient of expansion ranging from about 26–57 ppm/°C.; dielectric constant, @ 1 kHz and 50% RH, ranging from about 3.3 to about 3.5; volume resistivity of from about $10^{16}$ Ω-cm; and dissipation factor, @ 1 kHz of 0.002.

The Pyralin® SP and PD coating materials can be mixed with dielectric materials such as silica, glass ceramic and alumina to improve abrasion resistance and electrical properties of the finished, cured polyimide-comprising film. Preferably the loading of the dielectric material ranges from about 20% by weight to about 60% by weight, with about 40% by weight being more highly preferred.

Additional useful liquid polyimide precursor materials include polyamic acids, polyamic esters, polyisoimides, and mixtures thereof which can be crosslinked to form a three-dimensional network via sites at the vinyl or acetylenic end groups and sites at carbonyl groups contained within the polymeric chain. Such polyimide precursors are described in U.S. Pat. No. 4,568,601 to Araps et al., issued Feb. 4, 1986 and U.S. Pat. No. 5,654,223 to Araps et al., issued Mar. 31, 1987, both of which are hereby incorporated by reference in their entirety.

Further liquid polyimide precursor materials include siloxane-modified polyamic acids obtained upon the reaction of aromatic tetracarboxylic acid dianhydride, aromatic diamine and trialkoxy silane. Polyimide siloxane precursors of this kind are available from Amoco Chemical Company which represents the manufacturer, Chisso. In particular, Chisso PSI-N-6002 provides excellent adhesion, high thermal stability and low thermal expansion. Liquid precursor can be spin-coated upon a surface and cured to thicknesses in of about 0.5 mil (12.7 µ) in a single spin coat operation. The viscosity of the polyimide siloxane precursor is only about 200–300 cps, which is an order of magnitude lower that of conventional polyamic acid solutions, permitting easy penetration of surface roughness of a substrate and improving mechanical bonding to the substrate surface. This new polyimide siloxane cured at a temperature of 300° C. or more assumes a high molecular weight tri-dimensional structure with Si—O bonds. Its thermal decomposition temperature is about 550° C. In addition, the thermal expansion coefficient of a cured film of the PSI-N-6002 at temperatures greater than about 300° C. is approximately 30 to 50% of that for conventional aromatic polyimide films due to the presence of the three-dimensionally bonded Si—O networks of the PSI-N-6002.

Figure 3:
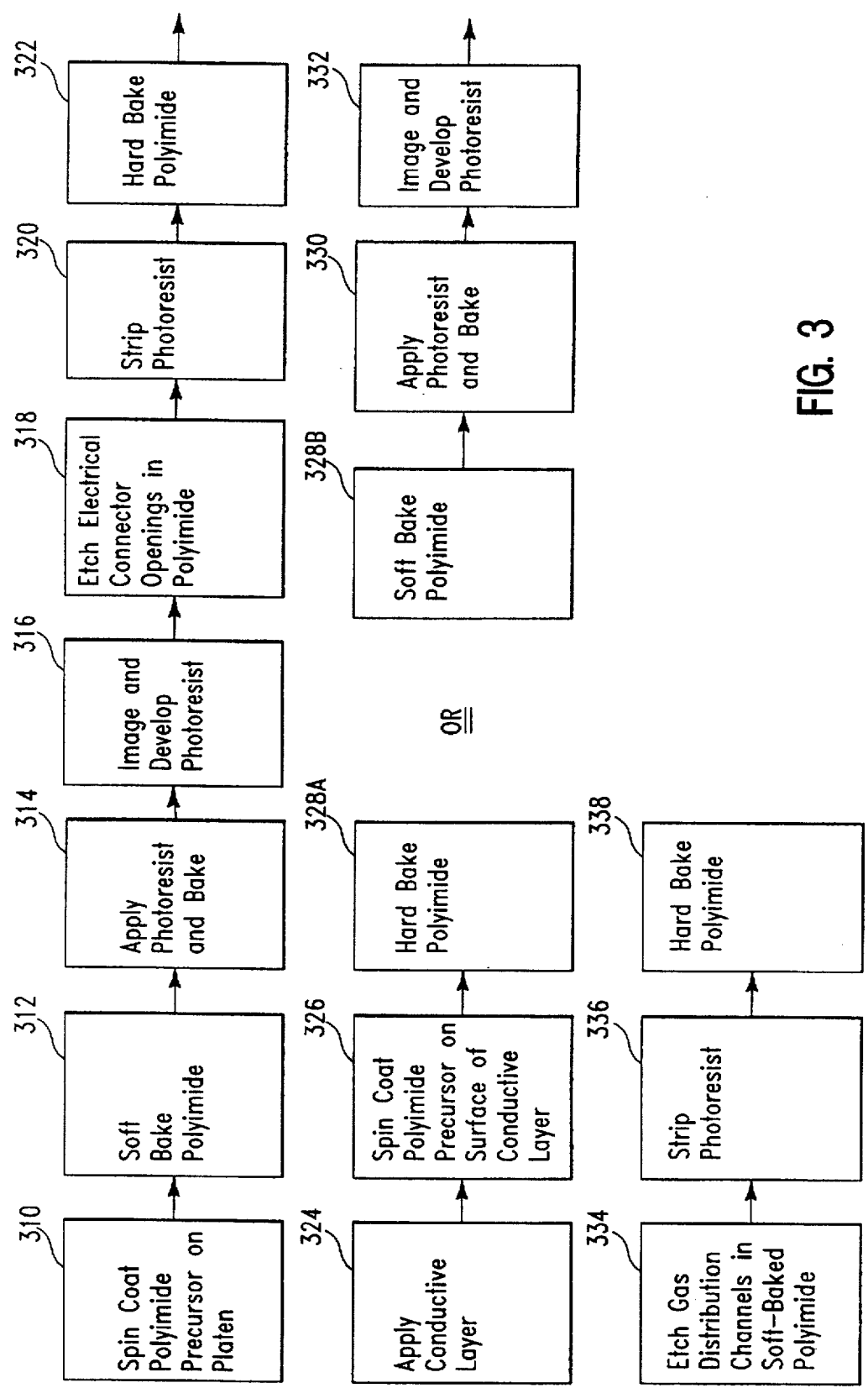
FIG. 3 is a process flow diagram showing a typical series of process steps for producing an electrostatic chuck multilayer structure using a liquid precursor for the polyimide-comprising layers of the structure.

With reference to FIG. 6, in one embodiment of the present invention, a multilayered electrostatic chuck means 600 is constructed by a series of process steps similar to those used in semiconductor fabrication. FIG. 3 shows a series of process steps which can be used to form a preferred embodiment of electrostatic chuck means upon the surface of a support platen 614 of the kind shown in FIG. 6.

The substrate support platen 614 is prepared to contain electrical connections 615 which can supply power to the conductive layer 620 of the electrostatic chuck 600. The method of preparing substrate support platen 614 containing electrical connections 615 is described subsequently herein. Preferably the electrical connections 615 are present (exposed) on the support surface 617 of support platen 614, as previously described.

A liquid polyimide precursor of the kind described above is spin coated onto the surface of such a support platen, as shown in FIG. 3, step 310. The coated polyimide precursor is then soft baked using techniques known in the industry, as shown in step 312. A positive photoresist is then applied and baked over the soft baked polyimide, as shown in step 314. The photoresist then imaged and developed, as shown in step 316, to provide a pattern on the surface of the soft baked polyimide which permits the etching of openings in the soft baked polyimide for such purposes as providing access to electrical connectors 615 present in the underlying support platen 614, as shown in step 318. After the soft baked polyimide layer is etched (using wet etch or plasma techniques), the photoresist is removed, as shown in step 320. After removal of the photoresist, the soft baked polyimide is hard baked, as shown in step 322, to provide a final cure of the polyimide film. After hard baking of the polyimide film, a conductive layer 620 such as a sputtered or vapor deposited copper or aluminum is applied over the polyimide film surface 619, as shown in step 324. The conductive layer 620 can be patterned by sputtering through a mask. As previously described, preferably conductive layer 620 ranges in thickness between about 1,000 Å and about 3,000 Å. Since copper and polyamic acids can react, it is preferable to apply chrome prior to deposition of the copper and advisable to apply chrome after deposition of the copper if a second polyamic acid precursor is to be applied over the surface of the conductive layer. As an alternative to sputtering or vapor deposition of the conductive layer, such conductive layer can be a copper or aluminum clad adhesiveless polyimide film (of the kind described with reference to first polymeric dielectric system above), including an adhesiveless thermoplastic polyimide layer for attachment to the underlying polyimide layer. However, a sputtered or vapor deposited conductive layer is preferable, as it is more conformal in nature and does not require lamination at the high temperature and pressure required for the clad adhesiveless polyimide film. Typical conductive materials applied by sputtering or vapor deposition include copper, aluminum, chromium, tungsten, nickel, and combinations thereof.

Subsequent to application of the conductive layer, as shown in step 324, the second polyimide film 622 is prepared by spin coating of liquid polyimide precursor over the surface of the conductive layer 620, as shown in step 326. The spin coated precursor can then be hard baked to a final, cured polyimide film if desired, as shown in step 328A. When it is desired to provide channels 630 in the upper surface of the second polyimide film 622, for heat transfer gas flow, the spin coated precursor of step 326 can be soft baked as shown in step 328B. Photoresist can be applied to provide the desired channel pattern and baked, as shown in step 330; imaged and developed, as shown in step 332; and heat transfer gas channels can be etched in the soft baked polyimide surface 632, as shown in step 334. The photoresist can then be stripped as shown in step 336 and the second polyimide film 622 cured to final composition, as shown in step 338. Depending on the composition of the photoresist material, stripping might not be necessary.

The number of steps required to produce the multilayered electrostatic chuck means 600 can be reduced from those shown in FIG. 3 by using a photosensitive polyimide which eliminates the need to use a photoresist. Due to the large scale dimensions of the multilayered electrostatic chuck means, compared with the dimensions used in the preparation of integrated circuits, use of a photosensitive polyimide is particularly practical. Photosensitive polyimide coating systems such as the PI-2700 series available from DuPont are discussed above. The manufacturer of these polyimide coating systems provides a detailed description of how they are imaged, developed and cured.

EXAMPLE 2

Construction of an Electrostatic Chuck Using the Second Polymeric System

1. Preparation of a Substrate

A substrate including coplanar feed through connections is prepared in the same manner as described in EXAMPLE 1.

2. Construction of a Preferred Embodiment Electrostatic Chuck

An electrostatic chuck 600 is then formed by spin coating a first layer of DuPont Pyralin® SP PI-1111 high temperature polyimide 616 over support surface 617. High temperature polyimide first layer 616 is then soft baked to a thickness of about 2.0 mil, and a photoresist (not shown) is applied over the surface of high temperature polyimide first layer 616, imaged, and developed. Openings 618 are then etched through high temperature polyimide layer 616 using wet etch techniques standard in the industry. The photoresist (not shown) is then removed. Subsequently, a conductive layer 620 of aluminum is sputtered over the exposed surface of high temperature polyimide layer 616 in a manner which provided contact 621 with the surface of solid center contact 610. Conductive layer 620 thickness is approximately 2,500 Å. Finally, a second layer of Pyralin® SP PI-1111 high temperature polyimide 622 is spin coated and hard baked to a thickness of about 1.5 mil (38.1 Å), over conductive layer 620, to complete the structure.

It is possible to use a combination of high temperature polyimide-comprising materials so that one polyimide-comprising layer is constructed from laminated polyimide-comprising films while the other layer is constructed using a liquid polyimide precursor which is applied the spin coat and bake technique.

A Second Preferred High Temperature Electrical Connector

As previously mentioned, the multilayered electrostatic chuck of the present invention requires an electrical connector capable of functioning at the same high temperatures which are typically greater than about 175° C., and can range as high as about 500° C.

Figure 4:
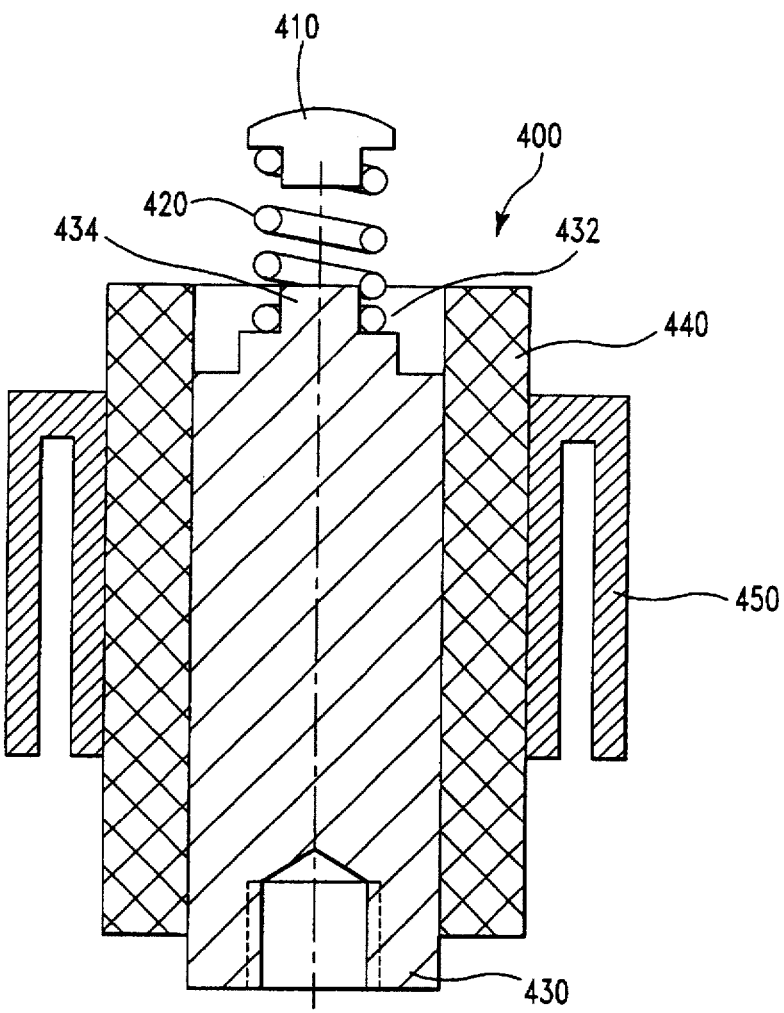
FIG. 4 shows a schematic of a second preferred high temperature electrical connection of the present invention.
Figure 5A:
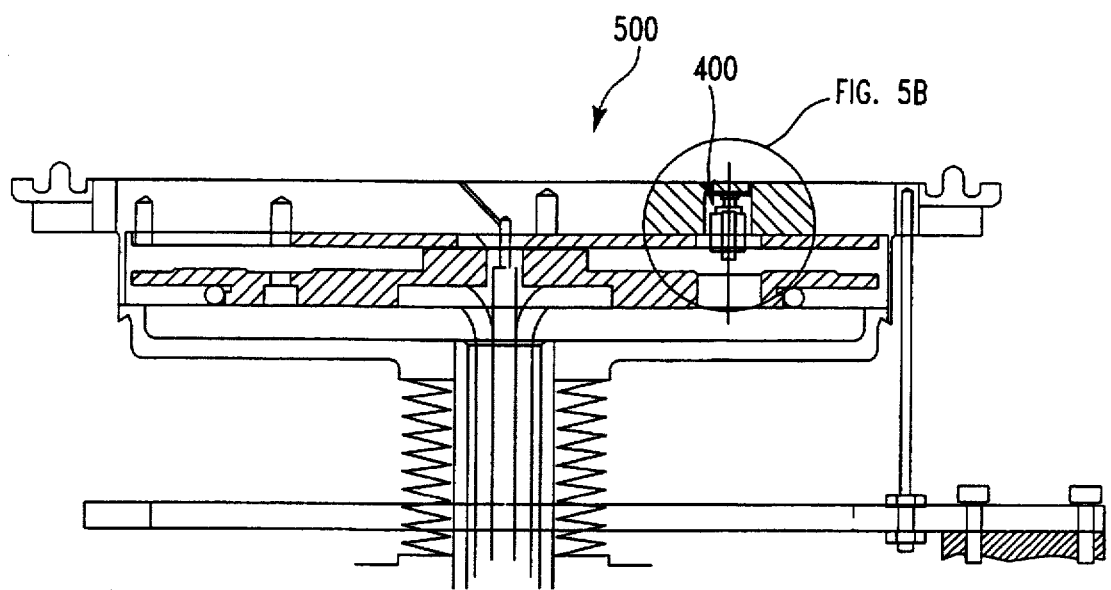
FIGS. 5A and 5B show a schematic of the electrical connection of FIG. 4 mounted (preferably welded) into a wafer support platen 110, where the electrical connector 400 makes contact with conductive extensions 116 extending from the electrostatic chuck (not shown) into the wafer support platen 110.
Figure 5B:
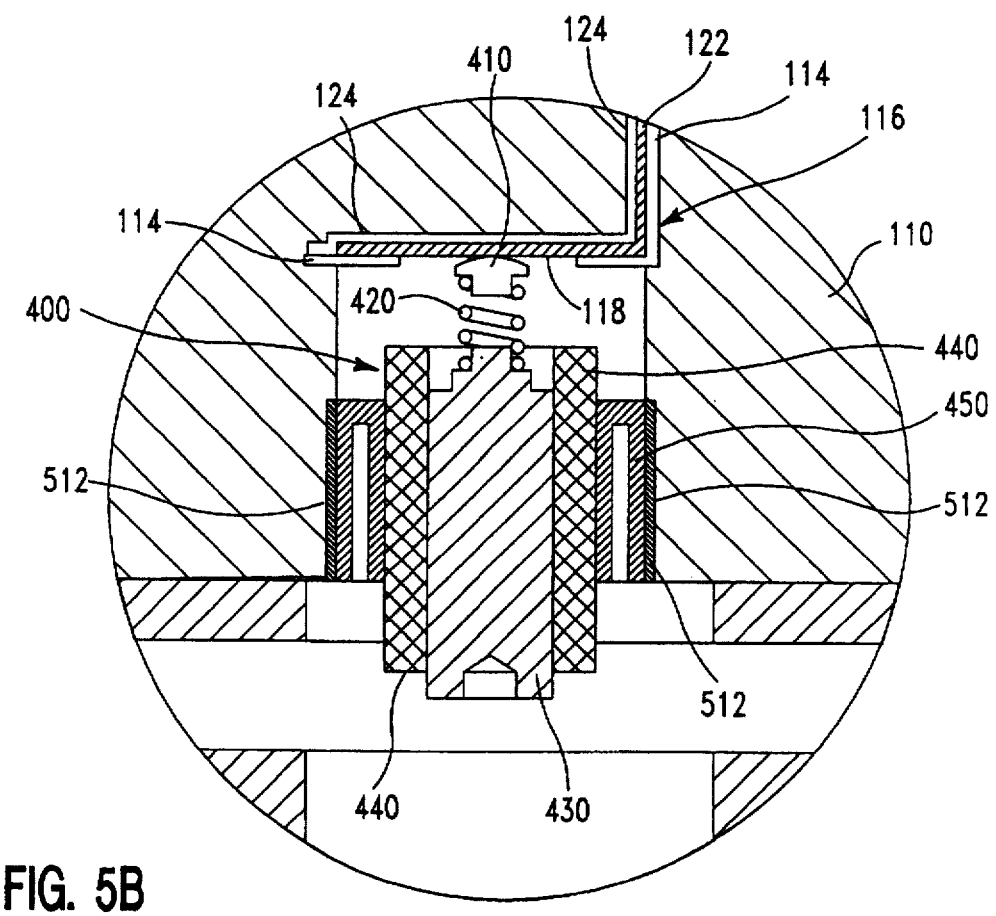

A second preferred electrical connector is illustrated in FIGS. 4 and 5. Electrical connector 400 of the present invention is designed to make contact with electrical connection extensions 116 of the type shown in FIG. 1 and in FIGS. 5A and 5B; these electrical connection extensions extend into the substrate support platen 110 from the electrostatic chuck means 112. To assure intimate contact with such extensions located within support platen 110, a spring loaded electrical connector is used. The spring loaded connector is preferably welded into support platen 110 to provide a vacuum seal between the electrical connector 400 and support platen 110.

A conductive contact button 410 extends from the top of electrical connector 400 to make contact with the conductive extensions 116 from electrostatic chuck means 112, as described above. Intimate contact is achieved between the conductive extensions and contact button 410 using a spring 420 to urge contact button 410 toward a conductive surface 118 of conductive extension 116. Spring 420 is connected at location 432 to an extension 434 of the upper portion of solid conductive center contact 430. Surrounding conductive center contact 430 is a dielectric insulator 440 which isolates center contact 430 from the surrounding wafer support platen 110. With reference to FIGS. 5A and 5B, dielectric insulator 440 is circumscribed by a conductive clip 450 which is welded 512 into a support platen 110. Conductive clip 450 is designed to have a thermal coefficient of expansion which is compatible between the thermal coefficient of expansion of dielectric insulator 440 and the conductive material of the wafer support platen 110.

The FIG. 5A wafer support system 500 includes electrical connector 400 welded 512 into a support platen 110. FIG. 5B shows conductive extension 116 which extends from the electrostatic chuck means (not shown) to provide electrical contact surface 118 within support platen 110. The conductive contact button 410 is urged into intimate contact with electrical contact surface 118 via spring 420.

The materials of construction of the high temperature electrical contact 400 are particularly critical. In one preferred embodiment of the present invention, these materials of construction are as follows: conductive contact button 410 is stainless steel; spring 420 is stainless steel; solid conductive center contact 430 is fabricated from niabrium; dielectric insulator 440 is constructed from 95–97% alumina; and conductive clip 450 is fabricated from Kovar. Other materials of construction having substantially equivalent relative thermal expansion coefficients, electrical, mechanical and chemical properties can be substituted. Insulator 440 is chosen to have a coefficient of thermal expansion which varies from the coefficient of expansion of solid conductive center contact 430 by less than about 10%. Further, the insulator 440 coefficient of thermal expansion should range between the coefficient of thermal expansion of solid conductive center contact 430 and the coefficient of thermal expansion of conductive clip 450, to reduce the stress created within and between these materials over the operational temperature of the electrostatic chuck.

The preferred embodiments of the present invention, as described above and shown in the Figures are not intended to limit the scope of the invention, as demonstrated by the claims which follow, since one skilled in the art can, with minimal experimentation, extend the scope of the embodiments to match that of the claims.

We claim:

1. A multilayer electrostatic chuck means comprising:
at least one self-adhered polyimide-comprising film acting as a dielectric layer within said electrostatic chuck, wherein said self-adhered polyimide-comprising film has a sustained operational temperature of at least 175° C.

2. The electrostatic chuck means of claim 1, comprising:
a first of said at least one self-adhered polyimide-comprising film adhered to an underlying substrate; at least one conductive layer overlying said first self-adhered polyimide-comprising film; and a dielectric film overlying said conductive layer, wherein said first polyimide-comprising film has a sustained operational temperature of at least 175° C.

3. The multilayer electrostatic chuck means of claim 2, wherein said conductive layer comprises a metal.

4. The multilayer electrostatic chuck means of claim 3, wherein said metal is selected from the group consisting of copper, aluminum, chromium, tungsten, nickel, and combinations thereof.

5. The multilayer electrostatic chuck means of claim 2, wherein said dielectric film overlying said conductive layer is a second self-adhered polyimide-comprising film having a sustained operational temperature of at least 175° C.

6. The multilayer electrostatic chuck means of claim 5, wherein said conductive layer comprises a metal.

7. The multilayer electrostatic chuck means of claim 6, wherein said metal is selected from the group consisting of copper, aluminum, chromium, tungsten, nickel, and combinations thereof.

8. The electrostatic chuck of claim 6, wherein said second polyimide-comprising film is a self-adhered thermoplastic polyimide-comprising film which is adhered to its underlying substrate using heat and pressure and said first self-adhered polyimide-comprising film is formed from a liquid precursor applied to said underlying substrate and cured in place to provide a solid, self-adhered polyimide-comprising film.

9. The electrostatic chuck means of claim 8, wherein the sustained operational temperature of said electrostatic chuck means is at least 200° C.

10. The multilayer electrostatic chuck means of claim 1, or claim 2, or claim 3, wherein the thickness of said at least one self-adhered polyimide-comprising film ranges between about 1 mil (25.4 µ) and about 3 mils (76.2 µ), whereby heat transfer through said electrostatic chuck means is improved.

11. The multilayer electrostatic chuck means of claim 5, or claim 6, or claim 7, wherein the thickness of said at least one self adhered polyimide-comprising film ranges between about 1 mil (25.4 µ) and about 3 mils (76.2 µ), and wherein the thickness of said metal ranges between about 1,000 Å and about 3,000 Å, whereby heat transfer through said electrostatic chuck means is improved.

12. The electrostatic chuck means of claim 1, claim 2, claim 3, claim 4, claim 5, claim 6, or claim 7, wherein the sustained operational temperature of said electrostatic chuck means is at least 200° C.

13. The electrostatic chuck means of claim 12, wherein the sustained operational temperature of said electrostatic chuck means is at least 400° C.

14. The electrostatic chuck means of claim 2, or claim 3, or claim 4, or claim 6, or claim 7, or claim 8, having a polyimide-comprising film which includes a thermoplastic polyimide layer which is self-adhered to its underlying substrate using heat and pressure.

15. The electrostatic chuck means of claim 14, wherein the sustained operational temperature of said electrostatic chuck means is at least 200° C.

16. The electrostatic chuck means of claim 2, or claim 3, or claim 4, or claim 5, or claim 6, or claim 7, wherein said first self-adhered polyimide-comprising film is formed from a liquid precursor applied to its underlying substrate and cured in place to provide a solid, self-adhered polyimide-comprising film.

17. The electrostatic chuck means of claim 16, wherein the sustained operational temperature of said electrostatic chuck means is at least 200° C.

* * * * *